(12) United States Patent
Hori et al.

(10) Patent No.: US 9,680,083 B2
(45) Date of Patent: Jun. 13, 2017

(54) COMPOSITE SUBSTRATE, PIEZOELECTRIC DEVICE, AND METHOD FOR MANUFACTURING COMPOSITE SUBSTRATE

(71) Applicant: NGK INSULATORS, LTD., Aichi (JP)

(72) Inventors: Yuji Hori, Owariasahi (JP); Tomoyoshi Tai, Inazawa (JP); Akira Hamajima, Nagoya (JP); Toshinao Nakahara, Kasugai (JP)

(73) Assignee: NGK INSULATORS, LTD., Aichi (JP)

( * ) Notice: Subject to any disclaimer, the term of this patent is extended or adjusted under 35 U.S.C. 154(b) by 143 days.

(21) Appl. No.: 14/565,902

(22) Filed: Dec. 10, 2014

(65) Prior Publication Data

US 2015/0091416 A1   Apr. 2, 2015

Related U.S. Application Data

(63) Continuation of application No. PCT/JP2013/069031, filed on Jul. 11, 2013.

(Continued)

(51) Int. Cl.
*H01L 41/09* (2006.01)
*H03H 9/25* (2006.01)
(Continued)

(52) U.S. Cl.
CPC .......... *H01L 41/0805* (2013.01); *H01L 41/22* (2013.01); *H03H 9/02574* (2013.01); *H03H 3/08* (2013.01); *Y10T 428/2495* (2015.01)

(58) Field of Classification Search
CPC ....... H03H 3/04; H01L 41/053; H01L 41/083; H01L 41/04; H01L 41/08; H01L 41/09; F02M 61/167

(Continued)

(56) References Cited

U.S. PATENT DOCUMENTS 5,998,907 A    12/1999  Taguchi et al.
8,490,260 B1 *  7/2013  Zhgoon .............. H03H 9/02574
                                                       29/25.35

(Continued)

FOREIGN PATENT DOCUMENTS

CN        102130663 A       7/2011
DE     102007037501 A1      2/2009

(Continued)

OTHER PUBLICATIONS

Office Action from German Patent App. No. 11 2013 003 488.3 (issue Jul. 21, 2016).

(Continued)

*Primary Examiner* — Thomas Dougherty
(74) *Attorney, Agent, or Firm* — Cermak Nakajima & McGowan LLP; Tomoko Nakajima

(57) ABSTRACT

A composite substrate 10 includes a piezoelectric substrate 12 and a support layer 14 bonded to the piezoelectric substrate 12. The support layer 14 is made of a material having no crystalline anisotropy in a bonded surface thereof and has a smaller thickness than the piezoelectric substrate 12. The piezoelectric substrate 12 and the support layer 14 are bonded together with an adhesive layer 16 therebetween. The composite substrate 10 has a total thickness of 180 μm or less. The base thickness ratio $Tr=t2/(t1+t2)$ is 0.1 to 0.4, where t1 is the thickness of the piezoelectric substrate 12, and t2 is the thickness of the support layer 14. The thickness t1 is 100 μm or less. The thickness t2 is 50 μm or less.

15 Claims, 2 Drawing Sheets

Related U.S. Application Data

(60) Provisional application No. 61/670,732, filed on Jul. 12, 2012.

(51) Int. Cl.
*H01L 41/08* (2006.01)
*H03H 9/02* (2006.01)
*H01L 41/22* (2013.01)
*H03H 3/08* (2006.01)

(58) Field of Classification Search
USPC .............. 310/313 A–313 D, 313 R, 346, 358
See application file for complete search history.

(56) References Cited

U.S. PATENT DOCUMENTS

| | | |
|---|---|---|
| 2004/0189146 A1 | 9/2004 | Ueda et al. |
| 2005/0194864 A1 | 9/2005 | Miura et al. |
| 2006/0043822 A1 | 3/2006 | Yokota et al. |
| 2007/0085446 A1* | 4/2007 | Chen .................. H03H 9/02582 310/313 R |
| 2007/0170813 A1 | 7/2007 | Takayama et al. |
| 2010/0187949 A1 | 7/2010 | Pahl et al. |
| 2012/0086312 A1 | 4/2012 | Kobayashi et al. |

FOREIGN PATENT DOCUMENTS

| | | |
|---|---|---|
| JP | 07-038361 A | 2/1995 |
| JP | 11-055070 A | 2/1999 |
| JP | 2004-297693 A | 10/2004 |
| JP | 2005-094254 A | 4/2005 |
| JP | 2005-252550 A | 9/2005 |
| JP | 2006-128809 A | 5/2006 |
| JP | 2006-245990 A | 9/2006 |
| JP | 2010-259011 A | 11/2010 |
| JP | 2010-536217 A | 11/2010 |

OTHER PUBLICATIONS

International Preliminary Report on Patentability for PCT Patent App. No. PCT/JP2013/069031 (Jan. 13, 2015).
International Search Report and Written Opinion for PCT Patent App. No. PCT/JP2013/069031 (Oct. 22, 2014).
Office Action from Japanese Patent App. No. 2014-524879 (Mar. 24, 2015).
Office Action from Chinese Patent App. No. 201380033657.1 (issued Aug. 4, 2016).

* cited by examiner

*Base thickness ratio Tr(%)=Base thickness ratio Tr × 100
　　　　=Thickness of support layer t2／(Thickness of piezoelectric substrate t1＋Thickness of support layer t2) × 100

COMPOSITE SUBSTRATE, PIEZOELECTRIC DEVICE, AND METHOD FOR MANUFACTURING COMPOSITE SUBSTRATE

BACKGROUND OF THE INVENTION

1. Field of the Invention

The present invention relates to composite substrates, piezoelectric devices, and methods for manufacturing composite substrates.

2. Description of the Related Art

There are known piezoelectric devices, such as sensors and surface acoustic wave devices, that include piezoelectric substrates. For example, PTL 1 discloses a surface acoustic wave device including a piezoelectric substrate having comb-shaped oscillating electrodes (IDT electrodes) formed thereon.

CITATION LIST

Patent Literature

PTL 1: Japanese Unexamined Patent Application Publication No. 2006-128809

SUMMARY OF INVENTION

Technical Problem

There is a need for smaller piezoelectric devices for use as electronic components in cellular phones. However, for example, it is difficult to reduce the mounting area of an SAW filter, which is a type of surface acoustic wave device, because the device size is determined by the operating frequency. Accordingly, a need exists for a thinner and therefore smaller (i.e., more compact) piezoelectric device, and a piezoelectric device with a thickness of 100 µm or less will be needed in future. It is difficult, however, to handle such a thin piezoelectric substrate because anisotropic single-crystal materials such as $LiTaO_3$ and $LiNbO_3$ tend to suffer damage such as cracking. Accordingly, there is a need for a piezoelectric substrate, such as a $LiTaO_3$ or $LiNbO_3$ substrate, that is thin and resistant to cracking.

In view of the foregoing problem, a primary object of the present invention is to provide a composite substrate that is thin and resistant to cracking.

Solution to Problem

A composite substrate of the present invention includes:

a piezoelectric substrate; and a support layer bonded to the piezoelectric substrate, the support layer comprising a material having no crystalline anisotropy in a bonded surface thereof and having a thickness smaller than or equal to the thickness of the piezoelectric substrate.

A piezoelectric device of the present invention includes:

the composite substrate described above; and electrodes formed on the piezoelectric substrate.

A method of the present invention for manufacturing a composite substrate includes the steps of:

(1) forming a support layer on a piezoelectric substrate, the support layer comprising a material having no crystalline anisotropy in a surface thereof bonded to the piezoelectric substrate; and (2) polishing a surface of the piezoelectric substrate, wherein the support layer is formed in the step (1) so as to have a thickness smaller than or equal to the thickness of the piezoelectric substrate polished in the step (2), or a surface of the support layer is polished during, before, or after the step (2) so as to have a thickness smaller than or equal to the thickness of the piezoelectric substrate polished in the step (2).

Advantageous Effects of Invention

In the composite substrate of the present invention, the support layer, which is made of a material having no anisotropy in the bonded surface thereof, is more resistant to cracking than, for example, piezoelectric materials such as lithium tantalate ($LiTaO_3$, also referred to as LT) and lithium niobate ($LiNbO_3$, also referred to as LN). Thus, the piezoelectric substrate can be reinforced with the support layer. This allows the composite substrate to be thinner and also allows the piezoelectric substrate to be more resistant to cracking than a piezoelectric substrate having no support layer. In the composite substrate of the present invention, the thickness of the piezoelectric substrate can be reduced, without cracking, to a thickness at which a piezoelectric substrate having no support layer would crack. The piezoelectric device of the present invention, which includes the composite substrate that is thin and resistant to cracking, as described above, is thinner than conventional piezoelectric devices. The method of the present invention for manufacturing a composite substrate allows the above composite substrate to be relatively easily manufactured.

DESCRIPTION OF EMBODIMENTS

Figure 1:
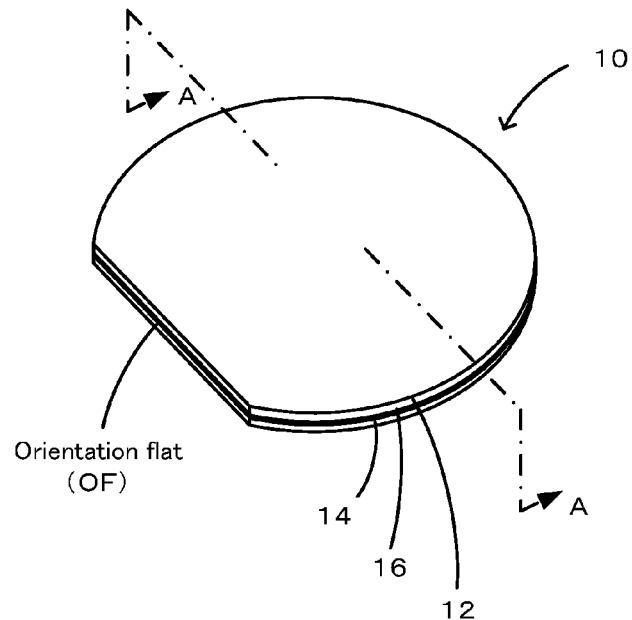
FIG. 1 is a schematic view illustrating an example composite substrate 10.

A composite substrate of the present invention includes a piezoelectric substrate and a support layer bonded to the piezoelectric substrate. The support layer is made of a material having no crystalline anisotropy in a bonded surface thereof and has a thickness smaller than or equal to the thickness of the piezoelectric substrate. Preferably, the support layer has a smaller thickness than the piezoelectric substrate. As the support layer becomes thinner, the entire composite substrate becomes thinner. The base thickness ratio $Tr=t2/(t1+t2)$ is preferably 0.1 or more, where t1 is the thickness of the piezoelectric substrate, and t2 is the thickness of the support layer, because an extremely thin support layer would be mechanically fragile. Furthermore, the base thickness ratio Tr is preferably 0.4 or less, more preferably 0.3 or less, because the composite substrate would otherwise warp excessively upon heating due to the difference in thermal expansion coefficient between the piezoelectric substrate and the support layer. The base thickness ratio Tr is preferably 0.1 to 0.4, more preferably 0.1 to 0.3. The thickness t1 of the piezoelectric substrate is, for example, but not limited to, 100 μm or less, and may be 50 to 70 μm. The thickness t2 of the support layer is, for example, but not limited to, 50 μm or less, and may be 10 to 20 μm. The diameter of the piezoelectric substrate is, for example, but not limited to, 50 to 150 mm. The diameter of the support layer is, for example, but not limited to, 50 to 150 mm.

The composite substrate of the present invention may have a total thickness of 180 μm or less, or may have a total thickness of 100 μm or less. As the entire composite substrate becomes thinner, a device including the composite substrate becomes thinner. The total thickness of a composite substrate including a piezoelectric substrate and a support layer bonded together with an adhesive layer therebetween is the sum of the thicknesses of the piezoelectric substrate, the support layer, and the adhesive layer. The total thickness of a composite substrate including a piezoelectric substrate and a support layer bonded together by direct bonding is the sum of the thicknesses of the piezoelectric substrate and the support layer.

Examples of materials for the piezoelectric substrate in the composite substrate of the present invention include lithium tantalate ($LiTaO_3$, also referred to as LT), lithium niobate ($LiNbO_3$, also referred to as LN), LN-LT solid solution single crystal, lithium borate, langasite, and quartz crystal. LT and LN are preferred if the composite substrate is used in a surface acoustic wave device such as an SAW filter. LT and LN are suitable for wide-band radio-frequency surface acoustic wave devices because they allow a surface acoustic wave to propagate at high speed and have high electromechanical coupling coefficients.

Examples of materials for the support layer in the composite substrate of the present invention include glasses such as borosilicate glass and quartz glass, Si, $SiO_2$, sapphire, and ceramics. Examples of ceramics include aluminum nitride, alumina, ZnO, and SiC. The use of a material having a thermal expansion coefficient close to that of the piezoelectric substrate for the support layer reduces the warpage of the composite substrate upon heating.

The composite substrate of the present invention may be a substantially disc-shaped wafer having an orientation flat (OF). Alternatively, the composite substrate of the present invention may be a chip cut from a wafer.

A method of the present invention for manufacturing a composite substrate includes the steps of (1) forming a support layer on a piezoelectric substrate and (2) polishing a surface of the piezoelectric substrate. The support layer is made of a material having no crystalline anisotropy in a surface thereof bonded to the piezoelectric substrate. The support layer is formed in the step (1) so as to have a thickness smaller than or equal to the thickness of the piezoelectric substrate polished in the step (2), or a surface of the support layer is polished during, before, or after the step (2) so as to have a thickness smaller than or equal to the thickness of the piezoelectric substrate polished in the step (2). Preferably, the support layer is formed in the step (1) so as to have a smaller thickness than the piezoelectric substrate polished in the step (2), or the surface of the support layer is polished during, before, or after the step (2) so as to have a smaller thickness than the piezoelectric substrate polished in the step (2).

In the step (1) of the method of the present invention for manufacturing a composite substrate, the support layer may be formed on the piezoelectric substrate by indirect bonding, i.e., by bonding together the piezoelectric substrate and the support layer with an adhesive layer therebetween. Alternatively, the support layer may be formed on the piezoelectric substrate by direct bonding. Examples of direct bonding techniques that can be used include surface-activated bonding, which is a room-temperature bonding technique using plasma surface activation.

After the support layer is formed on the piezoelectric substrate, the surfaces of the piezoelectric substrate and the support layer are polished in the step (2) such that the thickness of the support layer is smaller than or equal to (preferably, smaller than) the thickness of the polished piezoelectric substrate to obtain a composite substrate of the present invention. The polishing of the support layer may be omitted if the support layer can be formed in the step (1) so as to have a thickness smaller than or equal to (preferably, smaller than) the thickness of the polished piezoelectric substrate.

Figure 2:
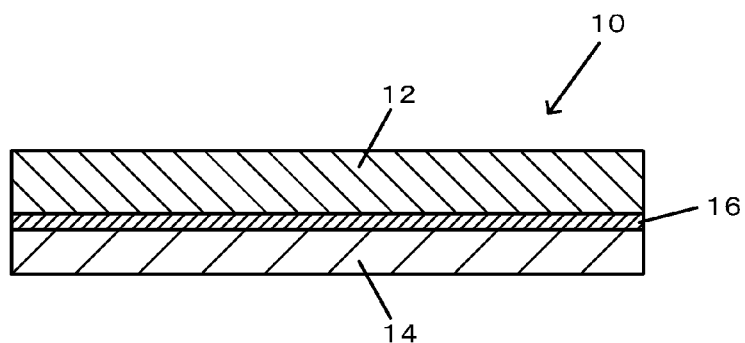
FIG. 2 is a sectional view taken along line A-A in FIG. 1.
Figure 3:
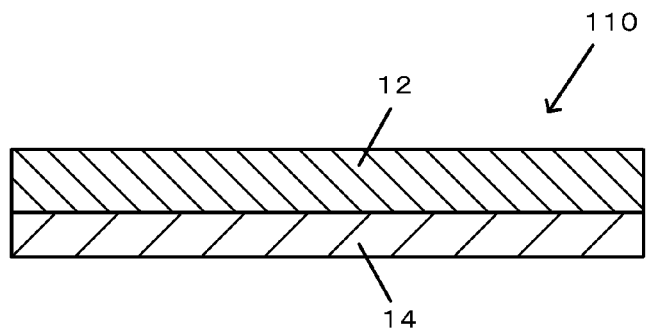
FIG. 3 is a schematic view illustrating an example cross-section of a composite substrate 110 including a piezoelectric substrate 12 and a support layer 14 bonded together by direct bonding.

FIG. 1 is a schematic view illustrating an example composite substrate 10 including a piezoelectric substrate 12 and a support layer 14 bonded together with an adhesive layer 16 therebetween. The composite substrate 10 in FIG. 1 is a substantially disc-shaped wafer having an orientation flat (OF). FIG. 2 is a sectional view taken along line A-A in FIG. 1. FIG. 3 is a schematic view illustrating an example cross-section of a composite substrate 110 including a piezoelectric substrate 12 and a support layer 14 bonded together by direct bonding.

A piezoelectric device of the present invention includes the composite substrate according to any of the above embodiments of the present invention and electrodes formed on the piezoelectric substrate.

Figure 4:
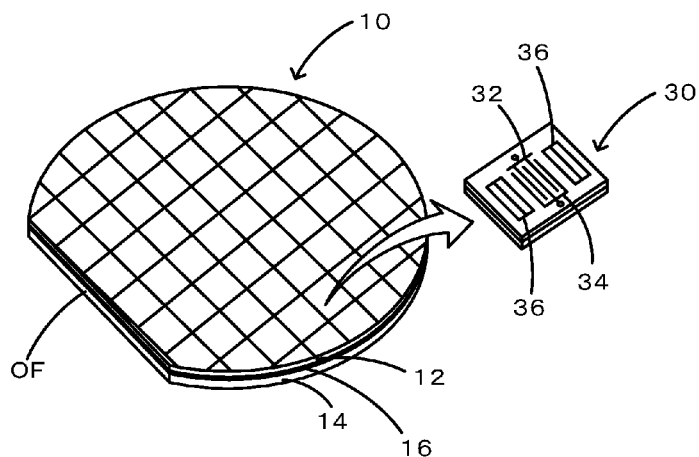
FIG. 4 is a schematic view illustrating an assembly of surface acoustic wave devices, i.e., one-port SAW resonators 30, fabricated on the composite substrate 10.

In the piezoelectric device of the present invention, the electrodes may be configured to oscillate the piezoelectric substrate. Examples of piezoelectric devices include sensors such as gyro sensors and acceleration sensors, piezoelectric actuators applicable to apparatuses such as droplet-ejecting apparatuses, quartz crystal oscillators, and surface acoustic wave devices such as resonators, filters, and convolvers. The piezoelectric device of the present invention can be manufactured, for example, by forming electrodes on the composite substrate of the present invention using a common photolithography process to fabricate an assembly of many piezoelectric devices and then dicing the composite substrate into discrete piezoelectric devices. FIG. 4 illustrates an assembly of surface acoustic wave devices, i.e., one-port SAW resonators 30, fabricated on the composite substrate 10. Each one-port SAW resonator 30 includes a pair of interdigital transducer (IDT) electrodes (also referred to as "comb-shaped electrodes" or "interdigital electrodes") 32 and 34 and reflective electrodes 36 formed on a surface of the piezoelectric substrate 12 by photolithography.

EXAMPLES

Examples 1 to 5

In Example 1, the composite substrate 10 shown in FIGS. 1 and 2 was fabricated as follows. In the step (1) of the method described above, a $LiTaO_3$ substrate (piezoelectric substrate 12) having a diameter of 4 inches and a thickness of 230 μm and a borosilicate glass substrate (support layer 14) having the same diameter and the same thickness were laminated together with an ultraviolet-curable resin therebetween. The borosilicate glass substrate was EAGLE XG (alkali-free glass) available from Corning Incorporated. The resin was cured with ultraviolet radiation to form the adhesive layer 16. In the step (2), the $LiTaO_3$ substrate was ground to a thickness of about 100 μm with a grinder and was then polished to a thickness of 80 μm by CMP to form a mirror surface. The borosilicate glass substrate was then similarly ground and polished to a final thickness of 10 μm to obtain an ultrathin wafer (composite substrate 10) of Example 1. In Examples 2 to 5, composite substrates were fabricated in the same manner except that the support layer 14 was made of ZnO ceramics, Si, HICERAM (registered trademark of NGK Insulators, Ltd., alumina ceramics), or SiC ceramics. The adhesive layer 16 had a thickness of 0.3 μm.

[Fabrication of Piezoelectric Device]

The composite substrates of Examples 1 to 5 were subjected to a normal electrode-forming process to fabricate SAW filters including IDT electrodes. Specifically, IDT electrodes were formed on the surface of the LiTaO$_3$ substrate of each composite substrate by a common photolithography process (applying and patterning a resist and then forming an electrode pattern by etching). The composite substrate was then diced into a plurality of discrete piezoelectric devices. Upon heating (150° C.) after the application of the resist in the process for manufacturing piezoelectric devices, the wafers (composite substrates) of Examples 1 to 4 deformed into a convex shape with the LiTaO$_3$ substrate facing upward by 3 to 10 mm (the amount of warpage due to deformation is referred to as "maximum displacement"). These devices, however, were successfully fabricated without breakage.

[Test for Base Thickness Ratio Tr]

Next, a composite substrate having the same structure shown in Example 1 was fabricated. Specifically, a composite substrate including a piezoelectric substrate 12 having a thickness of 80 μm and a borosilicate glass substrate (support layer 14) having a thickness of 10 μm (base thickness ratio Tr=0.11) was fabricated. To test a thinner borosilicate glass substrate, the surface of the borosilicate glass substrate was further polished by about 5 μm. As a result, the borosilicate glass substrate peeled from the edges of the piezoelectric substrate and was crushed during polishing, and the polished surface had numerous scratches. This is because the extremely thin glass substrate did not have a sufficient mechanical strength to withstand the polishing load. This demonstrates that the base thickness ratio Tr is preferably 0.1 or more and that the thickness of the support layer is preferably 10 μm or more. Conversely, to test a thicker borosilicate glass substrate (support layer 14), a composite substrate was fabricated as in Example 1 except that the LiTaO$_3$ substrate had a thickness of 40 μm and the glass substrate had a thickness of 60 μm (base thickness ratio Tr=0.6). When the wafer (composite substrate) was subjected to an electrode-forming process for fabricating SAW filters as in Example 1, the wafer was noticeably warped into a convex shape and was broken during the prebaking of the resist (heating to 150° C.)

[Relationship Between Base Thickness Ratio Tr and Maximum Displacement]

Figure 5:
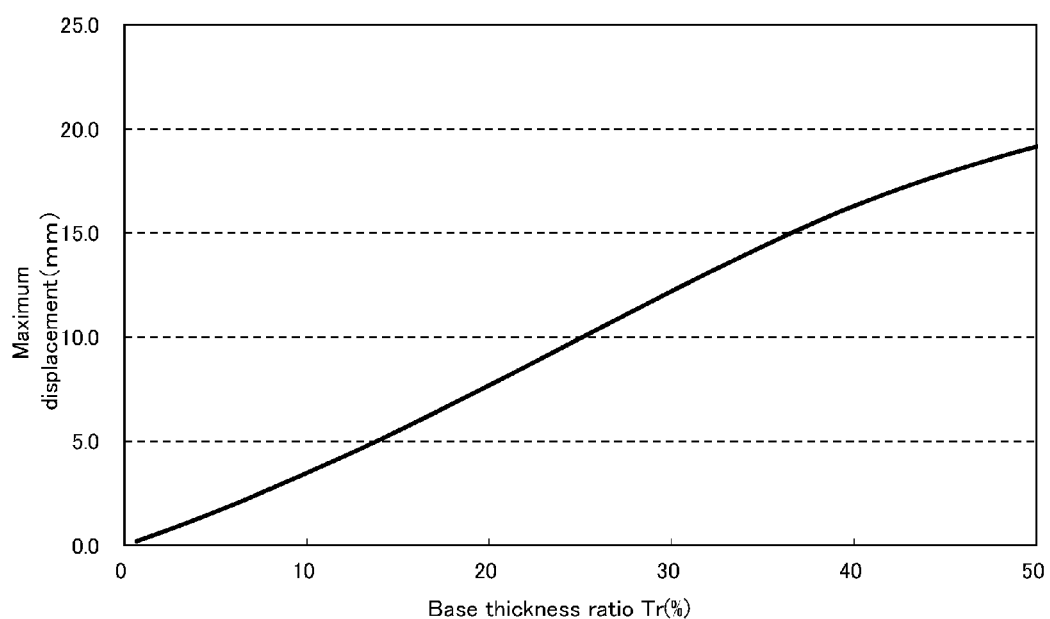
FIG. 5 is a graph showing the relationship between base thickness ratio Tr and maximum displacement with varying base thickness ratios Tr in Example 1.

A plurality of composite substrates were fabricated as in Example 1 except that the base thickness ratio Tr was varied by varying the thickness t2 of the borosilicate glass substrate (support layer 14), with the thickness t1 of the LiTaO$_3$ substrate (piezoelectric substrate 12) fixed at 100 μm. These composite substrates were similarly tested for the amount of warpage (maximum displacement) after the prebaking of the resist (heating to 150° C.). FIG. 5 is a graph showing the relationship between the base thickness ratio Tr and the maximum displacement with varying base thickness ratios Tr in Example 1. FIG. 5 demonstrates that the maximum displacement increases with increasing base thickness ratio Tr.

The above results demonstrate that an extremely thick or thin support layer is undesirable. The composite substrates having base thickness ratios Tr of 0.5 (50%) or less, as shown in FIG. 5, were not broken, whereas the composite substrate having a base thickness ratio Tr of 0.6, as described above, was broken. This demonstrates that the base thickness ratio Tr is preferably 0.5 or less, that is, the support layer preferably has a thickness smaller than or equal to the thickness of the piezoelectric substrate. To reduce the warpage of a composite substrate upon heating, the base thickness ratio Tr is preferably less than 0.5, more preferably 0.3 or less. Most preferably, the base thickness ratio Tr is 0.1 to 0.3 (10% to 30%).

In this regard, it is needless to say that the present invention is not limited to the above-described embodiment and can be executed in various aspects within the technical scope of the present invention.

The present application claims priority from U.S. Provisional Patent Application No. 61/670,732 filed on Jul. 12, 2012, the entire contents of which are incorporated herein by reference.

INDUSTRIAL APPLICABILITY

The present invention is applicable to piezoelectric devices, including sensors such as gyro sensors and acceleration sensors, piezoelectric actuators applicable to apparatuses such as droplet-ejecting apparatuses, surface acoustic wave devices such as resonators, filters, and convolvers, and quartz crystal oscillators.

What is claimed is:

1. A composite substrate comprising:
   a piezoelectric substrate including LiTaO$_3$ and having a thickness of 100 μm or less; and
   a support layer bonded to the piezoelectric substrate, the support layer comprising a material having no crystalline anisotropy in a bonded surface thereof and having a thermal expansion coefficient smaller than that of the piezoelectric substrate,
   wherein the support layer comprises borosilicate glass, a ceramics comprising ZnO, or a ceramics comprising alumina, and
   the base thickness ratio Tr=t2/(t1+t2) is 0.1 to 0.3, where t1 is the thickness of the piezoelectric substrate, and t2 is the thickness of the support layer.

2. The composite substrate according to claim 1, wherein the composite substrate has a total thickness of 100 μm or less.

3. A piezoelectric device comprising:
   the composite substrate according to claim 1; and
   electrodes formed on the piezoelectric substrate.

4. The composite substrate according to claim 1, wherein the support layer has a thickness of 10 μm to 20 μm.

5. The composite substrate according to claim 2, wherein the support layer has a thickness of 10 μm to 20 μm.

6. The composite substrate according to a claim 1, wherein the piezoelectric substrate has a thickness of 80 μm or less.

7. The composite substrate according to a claim 2, wherein the piezoelectric substrate has a thickness of 80 μm or less.

8. The composite substrate according to a claim 4, wherein the piezoelectric substrate has a thickness of 80 μm or less.

9. The composite substrate according to a claim 5, wherein the piezoelectric substrate has a thickness of 80 μm or less.

10. The composite substrate according to claim 1, wherein the piezoelectric substrate has a thickness of 50 μm to 70 μm.

11. The composite substrate according to claim 2, wherein the piezoelectric substrate has a thickness of 50 μm to 70 μm.

12. The composite substrate according to claim 4, wherein the piezoelectric substrate has a thickness of 50 μm to 70 μm.

13. The composite substrate according to claim 5, wherein the piezoelectric substrate has a thickness of 50 μm to 70 μm.

14. A piezoelectric device comprising:
   the composite substrate according to claim 2; and
   electrodes formed on the piezoelectric substrate.

15. A method for manufacturing a composite substrate, comprising the steps of:
   (1) forming a support layer on a piezoelectric substrate including $LiTaO_3$, the support layer comprising a material having no crystalline anisotropy in a surface thereof bonded to the piezoelectric substrate and having a thermal expansion coefficient smaller than that of the piezoelectric substrate; and
   (2) polishing a surface of the piezoelectric substrate so that the piezoelectric substrate has a thickness of 100 μm or less,
   wherein the support layer comprises borosilicate glass, a ceramics comprising ZnO, or a ceramics comprising alumina, and
   the support layer is formed in the step (1) so that the base thickness ratio $Tr=t2/(t1+t2)$ is 0.1 to 0.3, where t1 is the thickness of the piezoelectric substrate after being polished in the step (2) and t2 is the thickness of the support layer, or a surface of the support layer is polished during, before, or after the step (2) so that the base thickness ratio Tr=is 0.1 to 0.

* * * * *